(12) United States Patent
Breitwisch et al.

(10) Patent No.: US 7,972,966 B2
(45) Date of Patent: Jul. 5, 2011

(54) ETCHING OF TUNGSTEN SELECTIVE TO TITANIUM NITRIDE

(75) Inventors: Matthew J. Breitwisch, Yorktown Heights, NY (US); Eric A. Joseph, Yorktown Heights, NY (US); Chung H. Lam, Yorktown Heights, NY (US); Alejandro G. Schrott, Yorktown Heights, NY (US); Brandon Yee, Westbury, NY (US)

(73) Assignee: International Business Machines Corporation, Armonk, NY (US)

( * ) Notice: Subject to any disclaimer, the term of this patent is extended or adjusted under 35 U.S.C. 154(b) by 70 days.

(21) Appl. No.: 12/468,297

(22) Filed: May 19, 2009

(65) Prior Publication Data

US 2010/0297848 A1 Nov. 25, 2010

(51) Int. Cl.
*H01L 21/311* (2006.01)
(52) U.S. Cl. ........ 438/703; 438/734; 438/694; 438/710; 438/714; 438/715; 257/E21.219; 257/774
(58) Field of Classification Search .................. 438/597, 438/703, 734, 694, 710, 714, 715; 257/774, 257/E21.219
See application file for complete search history.

(56) References Cited

U.S. PATENT DOCUMENTS

| 5,854,104 A * | 12/1998 | Onishi et al. ................ 438/240 |
| 7,547,635 B2 * | 6/2009 | Eppler et al. ................ 438/710 |
| 2006/0125108 A1 | 6/2006 | Gutsche et al. |
| 2008/0014733 A1 * | 1/2008 | Liu ................................ 438/597 |
| 2010/0093151 A1 * | 4/2010 | Arghavani et al. ............ 438/424 |

\* cited by examiner

*Primary Examiner* — Jarrett J Stark
*Assistant Examiner* — Wilner Jean Baptiste
(74) *Attorney, Agent, or Firm* — Scully, Scott, Murphy & Presser, P.C.; Vazken Alexanian (57) ABSTRACT

The present invention in one embodiment provides an etch method that includes providing a structure including a tungsten (W) portion and a titanium nitride (TiN) portion; applying a first etch feed gas of sulfur hexafluoride ($SF_6$) and oxygen ($O_2$), in which the ratio of sulfur hexafluoride ($SF_6$) to oxygen ($O_2$) ranges from 1:3.5 to 1:4.5; and applying a second etch feed gas of nitrogen trifluoride ($NF_3$), helium (He) and chlorine ($Cl_2$), in which the ratio of nitrogen trifluoride ($NF_3$) to chlorine ($Cl_2$) ranges from 1:5 to 2:5 and the ratio of helium (He) to nitrogen trifluoride ($NF_3$) and chlorine ($Cl_2$) ranges from 1:3 to 1:1.

18 Claims, 4 Drawing Sheets

ETCHING OF TUNGSTEN SELECTIVE TO TITANIUM NITRIDE

FIELD OF THE INVENTION

In one embodiment, the present invention relates to dry etch gas mixtures and plasmas.

BACKGROUND OF THE INVENTION

In the manufacture of semiconductor devices, there is a need to make electrical contact to certain regions of the device. Normally, it is necessary to make contact to device regions underlying a dielectric on the surface of the silicon substrate by first forming an opening or via in the dielectric over the region to be contacted and next depositing a conductive material over the substrate surface and within the opening or via. The conductive material is then patterned for connecting different parts of the integrated circuit (that is, to form "interconnects" or "interconnect lines"). Traditionally, sputtered aluminum (Al) has been used as the conductive material. Typically, a blanket layer of aluminum is deposited on the surface of the silicon substrate covering any overlying dielectric as well as device regions exposed by openings in the dielectric. This is followed by a masking step that leaves photoresist positioned covering the openings or vias to the regions to which interconnects are formed. An etch step removes the aluminum from the areas not covered by photoresist, wherein the aluminum that is not removed by the etch step fills the openings or vias and forms the interconnect lines, thereby making electrical contact to the desired region.

As geometries have decreased to submicron levels and devices have become more densely packed on the substrate surface, the openings or vias to the device regions to be contacted have increasingly greater aspect ratios (ratio of height to width). Aluminum deposition alone has proven to be inadequate in devices with high aspect ratios. The problems encountered include poor step coverage, poor contact integrity, and inadequate planarity.

To overcome these shortcomings, tungsten and other refractory metals are used as a contact for devices with submicron contacts before aluminum deposition and patterning.

SUMMARY OF THE INVENTION

In one aspect, an etch method is provided for etching tungsten (W) selective to titanium nitride (TiN). In one embodiment, the etch method includes providing a structure including a tungsten (W) portion and a titanium nitride (TiN) portion; applying a first etch gas of sulfur hexafluoride ($SF_6$) and oxygen ($O_2$), in which the ratio of sulfur hexafluoride ($SF_6$) to oxygen ($O_2$) ranges from 1:3.5 to 1:4.5; and applying a second etch gas of nitrogen trifluoride ($NF_3$), helium (He) and chlorine ($Cl_2$), in which the ratio of nitrogen trifluoride ($NF_3$) to chlorine ($Cl_2$) ranges from 1:5 to 2:5, and the ratio of helium (He) to nitrogen trifluoride ($NF_3$) and chlorine ($Cl_2$) ranges from 1:3 to 1:1. In one embodiment, the tungsten (W) portion is a tungsten (W) metal stud disposed through a dielectric material and the titanium nitride (TiN) portion is a conformal liner that is present between the tungsten (W) metal stud and the dielectric material in which the tungsten (W) metal stud is positioned. In one example, the dielectric material in which the tungsten (W) metal stud is positioned in is composed of a boron phosphor silicate glass (BPSG) oxide.

In another aspect, a method of forming an electrode is provided. Broadly, the method of forming an electrode includes providing at least one tungsten (W) metal stud positioned in a via extending into a first dielectric layer, wherein an electrically conductive liner of titanium nitride (TiN) is positioned between at least a sidewall of the via and the at least one tungsten (W) metal stud; applying a first etch gas to recess an upper surface of the at least one tungsten (W) metal stud below an upper surface of the first dielectric layer to provide at least one recessed tungsten (W) metal stud, wherein the first etch gas is composed of sulfur hexafluoride ($SF_6$) and oxygen ($O_2$), in which the ratio of sulfur hexafluoride ($SF_6$) to oxygen ($O_2$) ranges from 1:3.5 to 1:4.5; applying a second etch gas to the at least one recessed tungsten metal stud, wherein the second etch gas is composed of nitrogen trifluoride ($NF_3$), helium (He) and chlorine ($Cl_2$), in which the ratio of nitrogen trifluoride ($NF_3$) to chlorine ($Cl_2$) ranges from 1:5 to 2:5 and the ratio of helium (He) to nitrogen trifluoride ($NF_3$) and chlorine ($Cl_2$) ranges from 1:3 to 1:1; and forming a second dielectric layer atop the at least one recessed metal stud, wherein an upper surface of the electrically conductive liner is exposed. In one example, the perimeter of the exposed upper surface of the electrically conductive liner represents a ring geometry when viewed from a top view.

Another aspect of the present invention is a method for forming a memory device, wherein the surface area of the electrical contact to the memory device is reduced by utilizing the above-described electrode. In one embodiment, this method includes the steps of: providing at least one tungsten (W) metal stud positioned in a via extending into a first dielectric layer, wherein an electrically conductive liner of titanium nitride (TiN) is positioned between at least a sidewall of the via and the at least one tungsten (W) metal stud; applying a first etch gas to recess an upper surface of the at least one tungsten (W) metal stud below an upper surface of the first dielectric layer to provide at least one recessed tungsten (W) metal stud, wherein the first etch gas is composed of sulfur hexafluoride ($SF_6$) and oxygen ($O_2$), in which the ratio of sulfur hexafluoride ($SF_6$) to oxygen ($O_2$) ranges from 1:3.5 to 1:4.5; applying a second etch gas to the at least one recessed tungsten metal stud, wherein the second etch gas is composed of nitrogen trifluoride ($NF_3$), helium (He) and chlorine ($Cl_2$), in which the ratio of nitrogen trifluoride ($NF_3$) to chlorine ($Cl_2$) ranges from 1:5 to 2:5 and the ratio of helium (He) to nitrogen trifluoride ($NF_3$) and chlorine ($Cl_2$) ranges from 1:3 to 1:1; forming a second dielectric layer atop the at least one recessed metal stud, wherein an upper surface of the electrically conductive liner is exposed; and forming a phase change memory cell in contact with the upper surface of the electrically conductive liner.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION OF THE INVENTION

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

The embodiments of the present invention relate to novel methods for forming electrodes and memory devices. When describing the methods, the following terms have the following meanings, unless otherwise indicated.

As used herein, the term "memory device" means a structure in which the electrical state thereof can be altered and then retained in the altered state; in this way a bit of information can be stored.

"Volatile memory" means memory in which stored information is lost when power to the memory cell is turned off.

"Non-volatile memory" means memory in which information stored is maintained after the power supply is turned off.

As used herein, an "anisotropic etch process" denotes a material removal process in which the etch rate in the direction normal to the surface to be etched is greater than in the direction parallel to the surface to be etched.

As used herein, "insulating" denotes a material having a room temperature conductivity of less than $10^{-10}$ $(\Omega\text{-m})^{-1}$.

"Electrically conductive" and/or "electrically communicating" as used through the present disclosure means a material typically having a room temperature conductivity of greater than $10^{-8}$ $(\Omega\text{-m})^{-1}$.

The term "electrical contact" denotes direct physical contact between two materials, wherein the interface between the two materials is electrically conductive.

As used herein, a "via" refers to a hole formed in a dielectric which is then filled with metal to provide vertical connection between stacked up interconnect metal lines and/or devices.

As used herein, a "metal stud" refers to the metal formed within a via.

As used herein, a "metal" is an electrically conductive material, in which metal atoms are held together by the force of a metallic bond, and the energy band structure of metal's conduction and valence bands overlap, and hence, there is no energy gap.

As used herein, a "phase change material" denotes a material that converts from an amorphous phase to a crystalline phase or vice versa upon the application of energy.

As used herein, a "barrier metal" is a material used to chemically isolate the phase change material from metals and provides an electrical contact between them.

As used herein, a "dielectric" is a non-metallic solid displaying insulating properties, having a filled valance band at OK, and a band gap on the order of approximately 5 eV.

As used herein, the term "resistive memory device" denotes a device whose effective electrical resistivity can be switched between two or more resistivity states upon an application of an energy pulse, such as a voltage or current pulse. Pulse time may range from approximately 5 nano-seconds to approximately $5 \times 10^5$ nano-seconds.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures.

FIGS. 1-6 depict embodiments of an etch method for etching tungsten (W) selective to titanium nitride (TiN). In one embodiment, the etch method includes providing a structure 100 including a tungsten (W) portion 115 and a titanium nitride (TiN) portion 120; applying a first etch feed gas 130 of sulfur hexafluoride (SF$_6$) and oxygen (O$_2$), in which the ratio of sulfur hexafluoride (SF$_6$) to oxygen (O$_2$) ranges from 1:3.5 to 1:4.5; and applying a second etch feed gas 135 composed of nitrogen trifluoride (NF$_3$), helium (He) and chlorine (Cl$_2$), in which the ratio of nitrogen trifluoride (NF$_3$) to chlorine (Cl$_2$) ranges from 1:5 to 2:5 and the ratio of helium (He) to nitrogen trifluoride (NF$_3$) and chlorine (Cl$_2$) ranges from 1:3 to 1:1.

Figure 1:
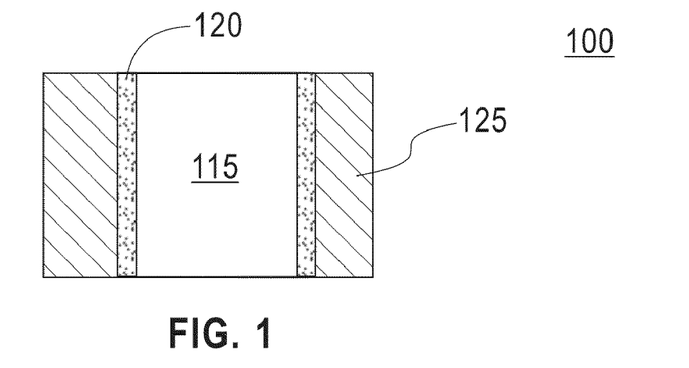
FIGS. 1-3 are side cross sectional views depicting one embodiment of an etch method for etching tungsten (W) selective to titanium nitride (TiN), in accordance with the present invention.

Referring to FIG. 1, in one embodiment, the tungsten (W) portion 115 is a tungsten (W) metal stud disposed through a dielectric material 125 and the titanium nitride (TiN) portion 120 is a conformal liner that is present between the tungsten (W) metal stud and the dielectric material 125 in which the tungsten (W) metal stud is positioned. In one embodiment, the dielectric material 125 in which the tungsten (W) metal stud is positioned in composed of boron phosphor silicate glass (BPSG) oxide.

Figure 2:
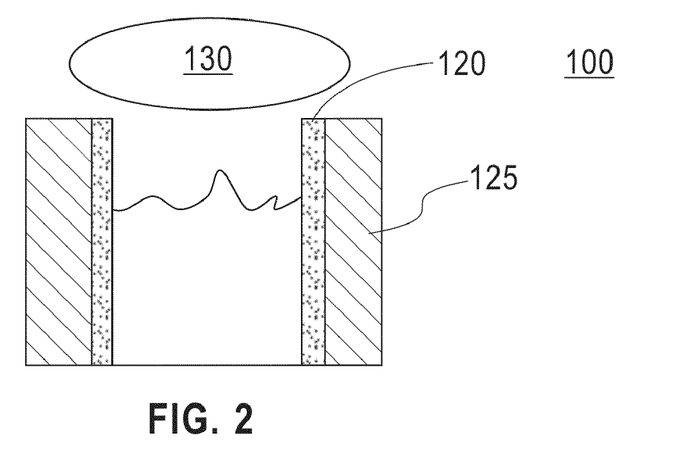

Referring to FIG. 2, in one embodiment, the first etch gas 130, which is composed of sulfur hexafluoride (SF$_6$) and oxygen (O$_2$), removes the tungsten (W) portion 115 selective to the titanium nitride (TiN) portion 120. In one embodiment, the first etch gas 130 is applied in a dry etch process. In one embodiment, the application of the first etch gas 130 may be by an anisotropic etch step, such as reactive ion etch. "Reactive Ion Etching" is a form of plasma etching, in which during etching the surface to be etched is placed on the RF powered electrode, wherein the surface to be etched takes on a potential that accelerates the etching species extracted from a plasma toward the surface to be etched in which the chemical etching reaction is taking place in the direction normal to the surface. In one embodiment, applying the first etch gas 130 includes a top power ranging from 400 watts to 600 watts. In another embodiment, applying the first etch gas 130 includes a top power ranging from 480 watts to 520 watts.

In one embodiment, the pressure at which the first etch gas 130 is applied may range from 15 mTorr to 35 mTorr. In another embodiment, the pressure at which the first etch gas 130 is applied may range from 20 mTorr to 30 mTorr.

In one embodiment, an $SF_6$ flow rate of the first etch gas 130 ranges from 10 seem to 20 sccm, and an $O_2$ flow rate of the first etch gas 130 ranges from 55 sccm to 75 sccm. In another embodiment, an $SF_6$ flow rate of the first etch gas 130 ranges from 13 sccm to 17 sccm, and an $O_2$ flow rate of the first etch gas 130 ranges from 60 sccm to 70 sccm.

In one embodiment, the first etch gas 130 that is composed of sulfur hexafluoride ($SF_6$) and oxygen ($O_2$) removes the tungsten (W) portion selective to the titanium nitride (TiN) portion, wherein the selectivity of the first etch gas for etching the tungsten (W) portion selective to the titanium nitride (TiN) portion is greater than 1.0:1. In another embodiment, the first etch gas that is composed of sulfur hexafluoride ($SF_6$) and oxygen ($O_2$) removes the tungsten (W) portion selective to the titanium nitride (TiN) portion, wherein the selectivity of the first etch gas for etching the tungsten (W) portion selective to the titanium nitride (TiN) portion is greater than 10:1 and less than 100:1.

In another embodiment, the selectivity of the first etch gas 130 for etching the tungsten (W) portion 115 selective to the titanium nitride (TiN) portion 120 is greater than 20:1. In another embodiment, the selectivity of the first etch gas 130 for etching the tungsten (W) portion 115 selective to the titanium nitride (TiN) portion 120 is greater than 30:1 and less than 100:1. In an even further embodiment, the selectivity of the first etch gas 130 for etching the tungsten (W) portion selective to the titanium nitride (TiN) portion is greater than 70:1 and less than 100:1. In yet another embodiment, the selectivity of the first etch gas for etching the tungsten (W) portion selective to the titanium nitride (TiN) portion is greater than 50:1.

In one embodiment, when the dielectric material 125 is boron phosphor silicate glass (BPSG) oxide, the first etch gas 130 that is composed of sulfur hexafluoride ($SF_6$) and oxygen ($O_2$) removes the tungsten (W) portion 115 selective to the titanium nitride (TiN) portion 120, wherein the selectivity of the first etch gas 130 for etching the tungsten (W) portion 115 selective to the titanium nitride (TiN) 120 is greater than 20:1, and the selectivity of the first etch gas 130 for etching the tungsten (W) portion 115 selective to the boron phosphor silicate glass (BPSG) oxide is greater than 20:1.

In one example, when the dielectric material 125 is boron phosphor silicate glass (BPSG) oxide, the first etch gas that is composed of sulfur hexafluoride ($SF_6$) and oxygen ($O_2$) removes the tungsten (W) portion selective to the titanium nitride (TiN) portion, wherein the selectivity of the first etch gas for etching the tungsten (W) portion selective to the titanium nitride (TiN) is greater than 50:1, and the selectivity of the first etch gas for etching tungsten (W) selective to boron phosphor silicate glass (BPSG) oxide is greater than 50:1. In another example, when the dielectric material 125 is boron phosphor silicate glass (BPSG) oxide, the first etch gas that is composed of sulfur hexafluoride ($SF_6$) and oxygen ($O_2$) removes the tungsten (W) portion selective to the titanium nitride (TiN) portion, wherein the selectivity of the first etch gas for etching the tungsten (W) portion selective to the titanium nitride (TiN) is greater than 50:1, and the selectivity of the first etch gas for etching tungsten (W) selective to boron phosphor silicate glass (BPSG) oxide is greater than 10:1.

In an even further example, when the dielectric material is boron phosphor silicate glass (BPSG) oxide, the first etch gas that is composed of sulfur hexafluoride ($SF_6$) and oxygen ($O_2$) removes the tungsten (W) portion selective to the titanium nitride (TiN) portion, wherein the selectivity of the first etch gas for etching the tungsten (W) portion selective to the titanium nitride (TiN) is greater than 1:1, and the selectivity of the first etch gas for etching tungsten (W) to boron phosphor silicate glass (BPSG) oxide is greater than 10:1 and less than 100:1. In another embodiment, when the dielectric material 125 is boron phosphor silicate glass (BPSG) oxide, the first etch gas 130 that is composed of sulfur hexafluoride ($SF_6$) and oxygen ($O_2$) removes the tungsten (W) portion 115 selective to the titanium nitride (TiN) portion 125, wherein the selectivity of the first etch gas 130 for etching the tungsten (W) portion 115 selective to the titanium nitride (TiN) 125 is greater than 50:1 and less than 3200:1, and the selectivity of the first etch gas 130 for removing the tungsten (W) portion 115 selective to the boron phosphor silicate glass (BPSG) oxide is greater than 100:1 and less than 200:1.

In one embodiment, the first etch gas removes tungsten (W) at a rate of greater than 80 Å/second.

Figure 3:
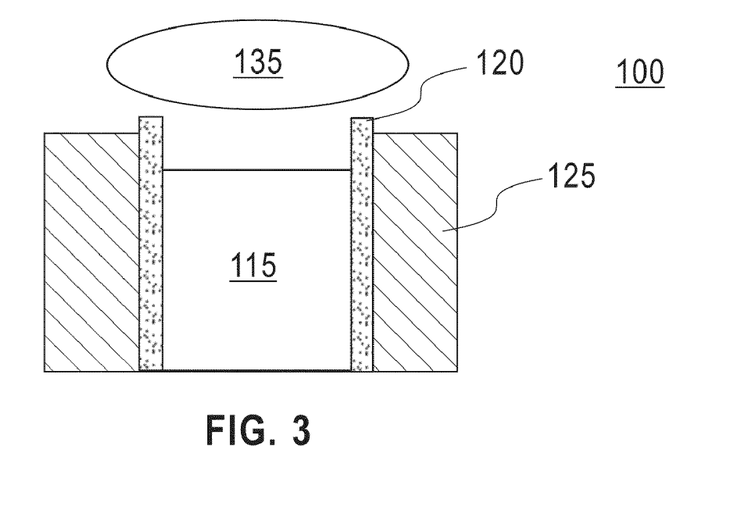

Referring to FIG. 3, in one embodiment, the second etch gas 135 that is composed of nitrogen trifluoride ($NF_3$), helium (He) and chlorine ($Cl_2$) smooths the surface of the tungsten (W) portion 115, without substantially etching the TiN portion 120 or the dielectric material 125. The etch rate of tungsten with the second etch feed gas is approximately 33% slower than the etch rate of tungsten with the first etch feed gas. The second etch gas that is composed of nitrogen trifluoride ($NF_3$), helium (He) and chlorine ($Cl_2$) smooths the surface of the tungsten (W) portion, without substantially etching the TiN portion or the dielectric.

In one embodiment, the application of the second etch gas 135 may have a greater isotropic nature than the first etch gas 130. In one embodiment, applying the second etch gas 135 includes a top electrode power ranging from 300 watts to 500 watts. In another embodiment, applying the second etch gas 135 includes a top power ranging from 350 watts to 450 watts. In one embodiment, applying the second etch gas 135 includes a bottom electrode power ranging from 40 watts to 80 watts. In another embodiment, applying the second etch gas 135 includes a bottom power ranging from 55 watts to 65 watts.

In one embodiment, the second etch gas 135 may be applied under a pressure ranging from 5 mTorr to 10 mTorr. In another embodiment, the second etch gas 135 may be applied under a pressure ranging from 5 mTorr to 6 mTorr.

The application of the second etch gas 135 includes a nitrogen trifluoride ($NF_3$) flow rate of 30 sccm to 50 sccm, and a chlorine ($Cl_2$) flow rate of from 70 sccm to 90 sccm and a helium (He) flow rate of 60 sccm to 100 sccm. In another embodiment, the application of the second etch feed gas 135 includes a nitrogen trifluoride ($NF_3$) flow rate of 38 sccm to 42 sccm, and an chlorine ($Cl_2$) flow rate of from 78 sccm to 82 sccm, and a helium (He) flow rate of 75 sccm to 85 sccm.

In one embodiment, the second etch gas 135 that is composed of trifluoride ($NF_3$), helium (He) and chlorine ($Cl_2$) removes the tungsten (W) portion 115 selective to the titanium nitride (TiN) portion 120, wherein the selectivity of the second etch gas 130 for etching the tungsten (W) portion 115 selective to the titanium nitride (TiN) portion is greater than 1:1 and less than 5:1. In another embodiment, the selectivity of the second etch gas 130 for etching the tungsten (W) portion 115 selective to the titanium nitride (TiN) portion is greater than 2:1 and less than 5:1. In yet another embodiment, the selectivity of the second etch gas for etching the tungsten (W) portion selective to the titanium nitride (TiN) portion is greater than 3:1 and less than 5:1. The second etch gas may remove tungsten (W) at a rate of less than 70 Å/second.

In one embodiment, when the dielectric material 125 is boron phosphor silicate glass (BPSG) oxide, the second etch gas that is composed of nitrogen trifluoride ($NF_3$), helium (He) and chlorine ($Cl_2$) removes the tungsten (W) portion 115 non-selective to the titanium nitride (TiN) portion 120, wherein the selectivity of the second etch gas 135 for etching the tungsten (W) portion selective 115 to the titanium nitride (TiN) portion 120 is greater than 50:1, and the selectivity of the second etch gas for etching tungsten (W) portion 115 selective to dielectric material 125 of boron phospho silicate glass (BPSG) oxide is less than 5:1. In another embodiment, the selectivity of the second etch gas for tungsten (W) to boron phosphor silicate glass (BPSG) oxide is greater than 1:1, and in some examples ranges from 1:1 to 3:1. The second etch feed gas 135 removes BPSG at a rate of 20 Å/second to 40 Å/second.

Figure 4:
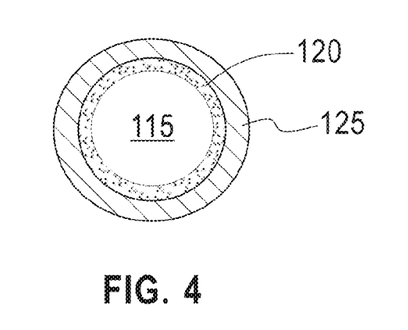
FIG. 4 is a top down planar view depicting one embodiment of an electrode formed using the etch method depicted in FIGS. 1-3.

FIG. 4 depicts a top view of the structure depicted in FIG. 3. As depicted in FIG. 4, an electrical contact may provided by the upper exposed surface of the titanium nitride liner 120, wherein a ring geometry is defined by the perimeter of the exposed surface of the titanium nitride liner 120.

Figure 5:
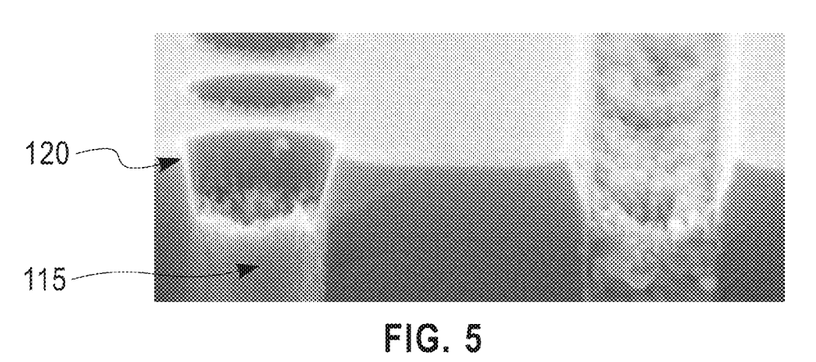
FIG. 5 is a micrograph of one embodiment of a tungsten (W) metal stud treated with the first etch gas composed of sulfur hexafluoride ($SF_6$) and oxygen ($O_2$), in accordance with the present invention.

FIG. 5 is a micrograph of a recessed tungsten (W) metal stud that is positioned in a boron phosphor silicate glass oxide, wherein a titanium nitride (TiN) conformal liner 120 that is present between the tungsten (W) metal stud 115 and the boron phosphor silicate glass oxide, wherein the tungsten (W) metal stud 115 has been recessed by a first etch gas of sulfur hexafluoride ($SF_6$) and oxygen ($O_2$), in which the ratio of sulfur hexafluoride ($SF_6$) to oxygen ($O_2$) ranges from 1:3.5 to 1:4.5. In one embodiment, the recessed metal tungsten metal stud 115 is recessed to a depth ranging from 20 nm to 200 nm, as measured from the upper surface of the boron phosphor silicate glass oxide.

Figure 6:
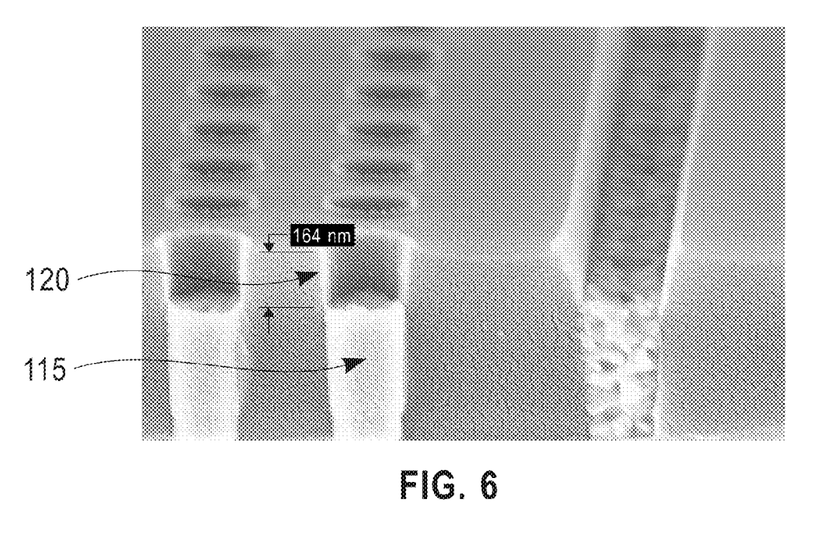
FIG. 6 is a micrograph of one embodiment of a tungsten (W) metal stud treated with the second etch gas composed of nitrogen trifluoride (NF$_3$), helium (He) and chlorine (Cl$_2$), in accordance with the present invention.

FIG. 6 is a micrograph of a recessed tungsten (W) metal stud 115 depicted in FIG. 5 following the application of the second etch gas composed of nitrogen trifluoride ($NF_3$) and chlorine ($Cl_2$), in which the ratio of nitrogen trifluoride ($NF_3$) to chlorine ($Cl_2$) ranges from 1:5 to 2:5.

FIGS. 7 to 12 depict embodiments of the present method for forming an electrode 145 that may be utilized to provide electrical contact to a memory cell 110. The electrode 145 is self-aligned to a metal stud 20, because the electrode 145 is formed from the barrier metal liner, i.e., electrically conductive liner 35, that is positioned between the metal stud 20 and the sidewall of the via 10 (also referred to as an opening), in which the metal stud 20 is formed. Therefore, the production of the electrode 145 does not require the formation of an additional photomask or hardmask than a process flow to provide the metal stud 20 and barrier metal liner, i.e., electrically conductive liner 35, positioned in the via 10.

Figure 7:
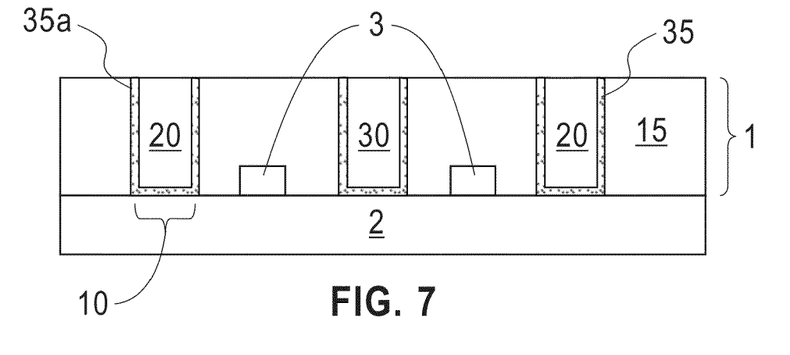
FIG. 7 is a side cross sectional view of an initial structure for forming a memory device including a first dielectric layer and conductive regions, such as a metal stud, extending through the first dielectric layer, as used in accordance with one embodiment of the present invention.

FIG. 7 depicts one embodiment of an interconnect level 1 atop a substrate 2, such as a semiconducting wafer. In one embodiment, the present method may begin following front end of the line (FEOL) processing, in which a device interconnect level 1 is provided that includes a first dielectric layer 15 having a plurality of openings 10, i.e., vias, that are filled with at least one conductive material, such as a metal stud 20 or a bar 30. In one embodiment, the first dielectric layer 15 may include a metal stud 20 that provides electrical conductivity to a first terminal (source/drain) of a select/access transistor (not shown) that is formed in the underlying substrate 2. In one embodiment, the first dielectric layer 15 may also include at least one metal bar 30, wherein the metal bar 30 is a conducting line that may be used to provide electrical conductivity to the second terminal (source/drain) of a select/access transistor positioned in the underlying substrate 2. In one embodiment, the first dielectric layer 15 may further include a lower conductive line 3. The lower conductive line 3 may be a word line, which may bias the gate of the select/access transistor that links the metal stud 20 with the metal bar 30.

The substrate 2 may include any number of active and/or passive devices (or regions) located within the substrate 2 or on a surface thereof. For clarity, the active and/or passive devices (or regions) are not shown in the drawings, but are nevertheless meant to be included with substrate 2. For example, the substrate 2 may comprise any semiconductor material including, but not limited to: Si, Ge, SiGe, SiC, SiGeC, InAs, GaAs, InP and other III/V compound semiconductors. The substrate 2 may be undoped, or doped. In one example, the doping of a Si-containing substrate may be light (having a dopant concentration of less than 1E17 atoms/$cm^3$) or heavy (having a dopant concentration of 1E17 atoms/$cm^3$ or greater). The substrate 2 can have any crystallographic orientation such, as (100), (110) or (111). Hybrid substrates having at least two planar surfaces of different crystallographic orientation are also contemplated.

In one embodiment, the device interconnect level 1 is formed atop the substrate 2 using deposition, etching and planarization. More specifically, in one embodiment of the invention, a first dielectric layer 15 is formed atop the substrate 2 by a deposition process including, for example, chemical vapor deposition (CVD), plasma-assisted CVD, evaporation, spin-on coating, or chemical solution deposition. The first dielectric layer 15 includes any suitable insulating material that is typically employed in interconnects to electrical devices. This includes inorganic dielectrics, organic dielectrics and combinations thereof, including, multilayers thereof. Illustrative examples of suitable materials for the first dielectric layer 15 include, but are not limited to: $SiO_2$, boron phosphor silicate glass (BPSG) oxide, fluorinated $SiO_2$, $Si_3N_4$, organic thermoset or thermoplastic dielectrics such as polyimides, polyarylenes, benzocyclobutenes and the like, spun-on glasses including organosilicate glass (OSG), with or without porosity, such as hydrogen silsesquixoane, methyl silsesquixoane, tetraethylorthosilicate (TEOS) and the like, amorphous alloys of Si, O, C and H, or SiCOH, amorphous alloys of Si, O, F and H.

The first dielectric layer 15 may comprise a low-k dielectric having a thickness ranging from 10 nm to 1000 nm. In another embodiment, the first dielectric layer 15 has a thickness on the order of 300 nm. In one embodiment, the dielectric constant of the first dielectric layer 15 may be less than 3.5. In another embodiment, the first dielectric layer 15 may have a dielectric constant that is from 1.0 to 3.0. Low-k dielectrics may include organic dielectrics, such as low dielectric constant polymer dielectrics, or may include low dielectric constant carbon-doped oxides. One example of a low-k dielectric polymer dielectric is SiLK™. Specifically, SiLK™ is a class of polymer-based low-k dielectric materials comprising a b-staged polymer having a composition including about 95% carbon. An example of a low dielectric constant carbon doped oxide is SiCOH.

After forming the first dielectric layer 15 on a surface of the substrate 2, openings 10 are formed into the first dielectric layer 15 so as to expose portions of the underlying substrate 2, in which device interconnects, such as metal studs 20 and/or metal bars 30 are subsequently formed. In one embodiment, the openings 10 are provided with a circular cross section when viewed from the top view. The circular cross section of the openings contributes to the ring geometry of the later formed electrodes. The openings 10, hereafter referred to as vias, are formed utilizing conventional lithography and etching. For example, the lithographic step may include applying a photoresist to the first dielectric layer 15, exposing the photoresist to a pattern of radiation and developing the pattern into the exposed photoresist utilizing a resist developer. The etching step used in providing the vias 10 into first dielectric layer 15 includes reactive ion etching (RIE), plasma etching, ion beam etching or laser ablation. Following etching, the photoresist is typically removed from the structure utilizing a resist stripping process, such as oxygen ashing.

In one embodiment, device interconnects, such as metal studs 20 and metal bars 30, are then formed within the vias 10 in the first dielectric layer 15 using deposition and planarization processes. In one embodiment, an electrically conductive liner 35 is positioned between the device interconnects' via sidewalls, and the upper surface of the underlying substrate 2.

Still referring to FIG. 7, in one embodiment, the electrically conductive liner 35 is deposited atop the horizontal and vertical surfaces of the via 10 within the first dielectric layer 15 including the exposed upper surface of the substrate 2 to provide electrical contacts to the devices positioned therein. In one embodiment, the electrically conductive liner 35 is a barrier metal. In one embodiment, the electrically conductive liner 35 is a substantially conformal layer The term "conformal layer" denotes a layer having a thickness that does not deviate from greater than or less than 20% of an average value for the thickness of the layer. In one embodiment, the electrically conductive liner 35 may comprise TiN or TaN. The electrically conductive liner 35 may have a thickness ranging from 2 nm to 50 nm. In one example, the electrically conductive liner 35 has a thickness on the order of 10 nm. The electrically conductive liner 35 may be deposited by sputter deposition or by chemical vapor deposition. Variations of CVD processes include, but not limited to, Atmospheric Pressure CVD (APCVD), Low Pressure CVD (LPCVD), Plasma Enhanced CVD (EPCVD), Metal-Organic CVD (MOCVD) and combinations thereof may also be employed. In one embodiment, the electrically conductive liner 35 prevents the electromigration of a conductive metal into the first dielectric layer 15.

Following the formation of the electrically conductive liner 35, a conductive material, such as Cu or W, is then formed utilizing a conventional deposition process, such as plating or sputtering, filling at least the vias 10. After filling the vias 10 with a conductive material, the structure is typically subjected to a planarization process, such as chemical-mechanical polishing or grinding, to provide a planar structure, as depicted in FIG. 7. Note that each top surface of conductive material, metal studs 20 and/or metal bars 30, is substantially coplanar with the abutting top surface of first dielectric layer 15. Note that the upper surface of the electrically conductive liner 35 is an exposed surface 35a that eventually provides the point of electrical contact between the electrically conductive liner 35 and the latter formed memory cell.

Figure 8:
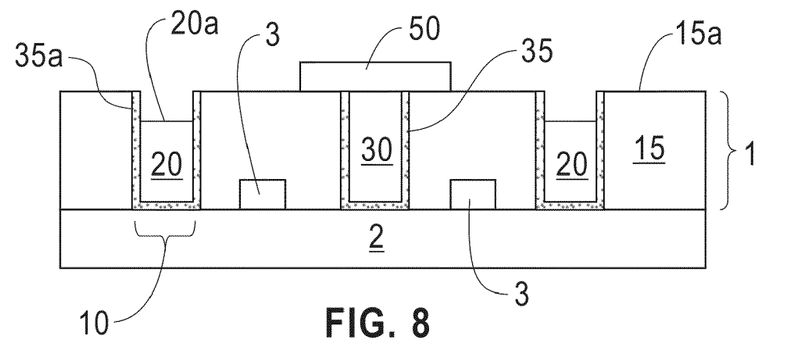
FIG. 8 is a side cross sectional view depicting recessing the upper surface of the metal stud below the upper surface of the first dielectric layer to provide a recessed metal stud, in accordance with one embodiment of the present invention.

FIG. 8 is a side cross sectional view depicting recessing of the upper surface of the metal stud 20 below an upper surface 15a of the first dielectric layer 15 to provide a recessed metal stud 20, in accordance with one embodiment of the present invention. In one embodiment, a protective photomask 50 is formed over the metal bar 30 prior to etching of the metal studs 20. In one embodiment, the protective photomask 50 is formed by depositing a layer of photoresist atop the substantially planar surface of the first dielectric layer 15, metal studs 20 and metal bar 30, wherein following deposition of the layer of photoresist, the resist is patterned to provide a photomask 50 that protects the metal bar 30.

Following photoresist patterning and development, the exposed portions of the device interconnects, i.e., metal studs 20, are etched using an anisotropic etch process, e.g., reactive ion etching, selective to the electrically conductive liner 35 and the first dielectric layer 15. In one embodiment, the metal studs 20 are composed of tungsten (W) and the electrically conductive liner 35 is composed of TaN or TiN, wherein recessing the upper surface of the metal studs 20 includes reactive ion etch processing with a sulfur hexafluoride/oxygen inductively coupled plasma having a density greater than $10^{10}$ cm$^3$ and having a flow ratio of 4:1 sulfur hexafluoride to oxygen. In another embodiment, the reactive ion etch chemistry may be $NF_3Cl_2$. An inductively coupled plasma is a high density plasma generated by an axial magnetic field that induces an electric field with circulation in the plane of the wafer and produces a plasma in which its density is decoupled from the ion energy at the substrate/electrode. In one embodiment, the above etch chemistry effectively removes tungsten, while being selective to TiN or TaN. In one embodiment, the upper surface of the tungsten metal studs 20 are recessed from 10 nm to 250 nm from the upper surface 15a of the first dielectric layer 15. In another embodiment, the upper surface of the tungsten metal studs 20 are recessed from 30 nm to 100 nm from the upper surface 15a of the first dielectric layer 15. In a further embodiment, the upper surface of the tungsten metal studs 20 are recessed from 10 nm to 50 nm from the upper surface 15a of the first dielectric layer 15. In yet an even further embodiment, the upper surface of the tungsten metal studs 20 are recessed from 20 nm to 50 nm from the upper surface 15a of the first dielectric layer 15.

In another embodiment, the metal studs 20 are composed of Cu and the electrically conductive liner 35 is TaN or TiN. The Cu is etched selective to the electrically conductive liner 35, which may be composed of TaN or TiN. In one embodiment, the etch chemistry that removes Cu selective to TaN or TiN is an ammonium per sulfide $(NH_4)_2 S_2O_8$) solution. In one embodiment, the etch chemistry that removes Cu selective to TaN or TiN is a sulfuric acid ($H_2SO_4$) solution. In one embodiment, the upper surface of the Cu metal studs 20 is recessed from 10 nm to 250 nm from the upper surface 15a of the first dielectric layer 15. In another embodiment, the upper surface of the Cu metal studs 20 is recessed from 30 nm to 100 nm from the upper surface 15a of the first dielectric layer 15. In a further embodiment, the upper surface of the Cu metal studs 20 is recessed from 20 nm to 50 nm from the upper surface 15a of the first dielectric layer 15.

In one embodiment, recessing the metal studs 20 below the upper surface 15a of the first dielectric layer 15 exposes the sidewalls of the electrically conductive liner 35 disposed on the via 10 sidewalls, hence providing a cavity in the upper portion of the via 10. Following etch recess, the upper surface of the metal stud 20, the protective photomask 50 removed using a chemical strip.

Figure 9:
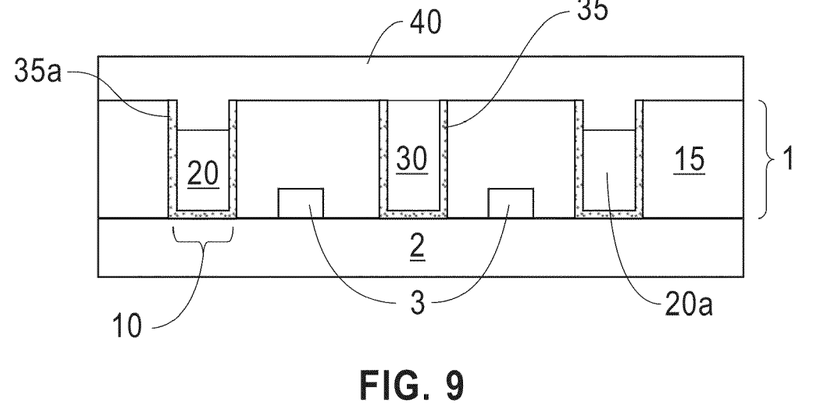
FIG. 9 is a side cross sectional view depicting forming a second dielectric layer atop the recessed metal stud, in accordance with at least one embodiment of the present invention.

FIG. 9 is a side cross sectional view depicting the formation of a second dielectric layer 40 atop the recessed metal stud 20, the electrically conductive liner 35 and the first dielectric layer 15, in accordance with the present invention. In one embodiment, the second dielectric layer 40 is deposited atop the recessed metal stud 20 filling the cavity formed in the upper portion of the via 10. Similar to the first dielectric layer 15, the second dielectric layer 40 includes any suitable insulating material that is typically employed in interconnects to electrical devices. The second dielectric layer 40 may comprise the same or a different dielectric from the first dielectric layer 15. In one embodiment, the second dielectric layer 40 may be composed of high density plasma (HDP) PECVD silicon oxide having a thickness ranging from 10 nm to 300 nm. In one embodiment, the dielectric constant of the second dielectric layer 40 may range from 2 to 100. In one embodiment, the second dielectric layer 40 is formed by a deposition process including, for example, chemical vapor deposition (CVD), plasma-assisted CVD, evaporation, spin-on coating, or chemical solution deposition.

In a following step, in one embodiment a planarization process exposes the upper surface 35a of the electrically conductive liner 35, in accordance with the present invention. In one embodiment, the planarization process includes chemical mechanical planarization (CMP). The planarization process is continued until an upper surface 35a of the electrically conductive liner 35 is exposed. The exposed upper surface 35a of the electrically conductive liner 35 provides electrical contact to a later formed memory cell, hence providing an electrode 145.

Following the formation of the electrode 145, a memory device for non-volatile or volatile memory may be provided in electrical contact to the exposed surface of the electrically conductive liner 35, wherein the memory device may include a resistive memory or phase change memory element.

Figure 10:
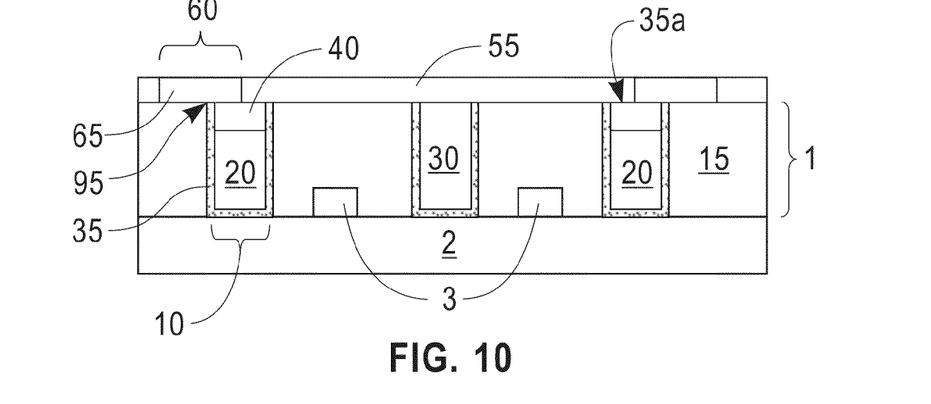
FIGS. 10-12 are side cross sectional views depicting forming a phase change material memory cell in electrical contact with the exposed upper surface of the electrically conductive liner, in accordance with another embodiment of the present invention.
Figure 11:
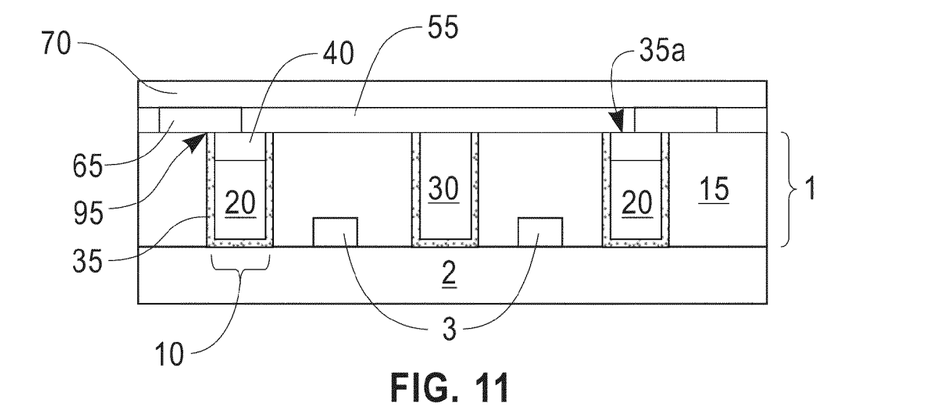
Figure 12:
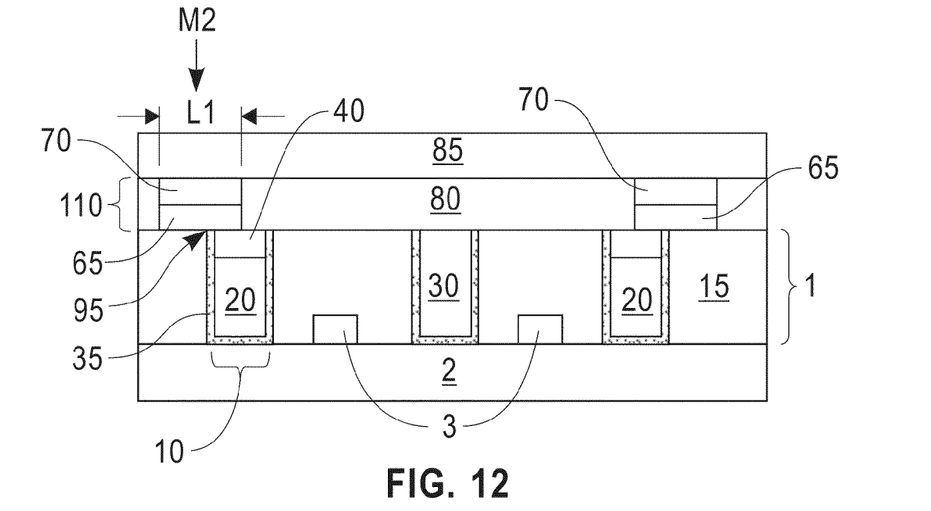

FIGS. 10-12 depict one embodiment of forming a phase change material memory cell 110 in electrical contact with the exposed upper surface of the electrically conductive liner 35.

Referring to FIG. 10, in one embodiment, forming the phase change-memory cell 110 includes depositing a third dielectric layer 55 atop the upper surface of first dielectric layer 15, upper surface 35a of the electrically conductive liner 35 and second dielectric layer 40; patterning and etching the third dielectric layer 55 to provide openings 60 exposing a portion of the upper surface 35a of the electrically conductive liner 35; and then depositing a phase change material 65 at least filling the openings 60. In one embodiment, the thickness of the phase change material 65 may range from 10 nm to 400 nm. Deposition of the phase change material 65 may include blanket deposition of the phase change material 65 followed by planarization to provide an upper surface of the phase change material 65 that is substantially coplanar with the upper surface of the third dielectric layer 55.

In one embodiment, the phase change material 65 may be switched from an amorphous phase to a crystalline phase. When in an amorphous state, the phase change material 65 exhibits a high resistivity, typically ranging from $10^2$ ohm-m to $10^4$ ohm-m. When in a crystalline state, the phase change material 65 is more conductive, exhibiting a lower resistivity typically ranging from $10^{-5}$ ohm-m to $10^{-2}$ ohm-m. In one embodiment, the phase change material 65 may comprise chalcogenide alloys. The term "chalcogenide" is used herein to denote an alloy or compound material, which contains at least one element from Group VI of the Periodic Table of Elements. Illustrative examples of chalcogenide alloys that can be employed herein include, but are not limited to, alloys of Te or Se with at least one of the elements of Ge, Sb, As, Si. In other embodiments, the phase change material is made of any suitable material including one or more of the elements Te, Ga, In, Se, and S. In one embodiment, the phase change material liner has a composition of $Ge_2Sb_2Te_5$ (GST). Although chalcogenides are a group of materials commonly utilized as phase change material, some phase change materials, such as GeSb, do not utilize, chalcogenides. Thus, a variety of materials can be used in a phase change material cell as long as they can retain separate amorphous and crystalline states of distinct resistivity.

In one embodiment, a phase change material 65 composed of GST when at a temperature of about 25° C. is in an amorphous phase. As the temperature of the GST phase change material is increased to 125° C. to 150° C., the resistivity of the phase change material decreases representing the transition temperature for a phase change from an amorphous phase to Face Center Cubic (FCC) phase. Further increases in the temperature of the GST phase change material to greater than about 180° C. result in further decreases in resistivity, which result from a phase change from the Face Centered Cubic (FCC) phase to a Hexagonal (Hex) phase of the GST. When the temperature of the GST phase change material is increased above the melting temperature (approximately 620° C.), the GST phase change material melts and upon quench returns to the amorphous solid phase. Quench denotes solidification in a time period on the order of 0.5 to 50 nanoseconds.

Referring to FIG. 11, in one embodiment of the present invention, a barrier metal 70 is formed atop the phase change material 65. In one embodiment the barrier metal 70 is TiN, TaN or a combination thereof. In one embodiment, the barrier metal 70 is blanket deposited by a physical deposition process, such as sputtering. In another embodiment, the barrier metal 70 may be deposited by chemical vapor deposition. In one embodiment, the layer of barrier metal 70 may have a thickness ranging from 20 nm to 200 nm. Following deposition, the barrier metal 70 is patterned and etched to correspond to the phase change material 65.

In one embodiment, a fourth dielectric is deposited and planarized to provide a fourth dielectric layer 80 having an upper surface substantially coplanar to an exposed upper surface of the barrier metal 70. Following planarization to expose the barrier metal, an upper conductive line 85 is formed in electrical contact to the barrier metal 70, as depicted in FIG. 12.

In one embodiment, the conductive line 85 is word line or bit line. In one embodiment, the conductive line 85 is a metal. Examples of metals used to provide the upper conductive line 85 may include Cu, Ti, Ta, W, Al, Pd, Pt, Ag, Au or alloys and combinations thereof.

Referring to FIG. 12, in one embodiment, at least the phase change material 65 of the memory cell 100 is offset from the electrically conductive liner 35. The term "offset" means that the center of the phase change material 65 is offset from the center of the via 10, wherein the electrically conductive liner 35 is formed on the via sidewalls. In one embodiment, the center of the via 10 is the midpoint $M_2$ of the diameter $L_1$ of a circular electrically conductive liner 35, also referred to as ring electrode, when viewed from a top plan view. In embodiments of the invention in which the electrically conductive liner 35 does not have a circular geometry, the center of the via 10 is the midpoint of the dimension defining the separation of opposing sidewalls of the via 10. The center of the phase change material 65 means the midpoint $M_2$ of the greatest dimension $L_1$ defining the phase change material 65, e.g., width, that is parallel to the plane defined by the upper surface of the phase change material 65. In one embodiment, by providing a memory cell 110 in which the phase change material 65 is offset and in electrical contact with only a portion the electrically conductive liner 35, the surface area of the electrical contact 95 between the two structures is reduced in comparison to when the entire upper surface of the electrically conductive liner 35 is in electrical contact with the phase change material 65 of the memory cell 110.

In one embodiment, the phase change material 65 is in electrical contact with ¼ to ¾ of the upper surface of electrically conductive liner 35. In another embodiment, the phase change material 65 is in electrical contact with less than ½ the upper surface of the electrically conductive liner 35. In one embodiment, the surface area of the direct physical contact 95 of the phase change material 65 and the upper surface of the electrically conductive liner 35 may range from 100 nm² to 10000 nm². In another embodiment, the surface area of the direct physical contact 95 of the phase change material 65 and the upper surface of the electrically conductive liner 35 may range from 100 nm² to 1000 nm².

While the present invention has been particularly shown and described with respect to the preferred embodiments thereof, it will be understood by those skilled in the art that the foregoing and other changes in forms of details may be made without departing form the spirit and scope of the present invention. It is therefore intended that the present invention not be limited to the exact forms and details described and illustrated, but fall within the scope of the appended claims.

What is claimed:

1. An etch method comprising:
   providing a structure including a tungsten (W) portion and a titanium nitride (TiN) portion;
   applying a first etch gas of sulfur hexafluoride ($SF_6$) and oxygen ($O_2$), in which the ratio of sulfur hexafluoride ($SF_6$) to oxygen ($O_2$) ranges from 1:3.5 to 1:4.5; and
   applying a second etch gas of nitrogen trifluoride ($NF_3$), helium (He) and chlorine ($Cl_2$), in which the ratio of nitrogen trifluoride ($NF_3$) to chlorine ($Cl_2$) ranges from 1:5 to 2:5 and the ratio of helium (He) to nitrogen trifluoride ($NF_3$) and chlorine ($Cl_2$) ranges from 1:3 to 1:1.

2. The etch method of claim 1, wherein the etch method is a dry etch process.

3. The etch method of claim 1, wherein the tungsten (W) portion is a tungsten (W) metal stud disposed through a dielectric material and the titanium nitride (TiN) portion is a conformal liner that is present between the tungsten (W) metal stud and the dielectric material in which the tungsten (W) metal stud is positioned.

4. The etch method of claim 3, wherein the dielectric material in which the tungsten (W) metal stud is positioned is composed of boron phosphor silicate glass (BPSG) oxide.

5. The etch method of claim 4, wherein the first etch gas removes the tungsten (W) portion selective to the titanium nitride (TiN) portion, wherein the selectivity of the first etch gas for etching the tungsten (W) portion selective to the titanium nitride (TiN) is greater than 50:1, and the selectivity of the first etch gas for tungsten (W) to boron phosphor silicate glass (BPSG) oxide is greater than 50:1.

6. The etch method of claim 4, wherein the second etch gas removes the tungsten (W) portion selective to the titanium nitride (TiN) portion, wherein the selectivity of the second etch gas for etching the tungsten (W) portion selective to the titanium nitride (TiN) is greater than 3:1, and the selectivity of the second etch gas for the tungsten (W) portion to the boron phosphor silicate glass (BPSG) oxide is greater than 1:1.

7. The method of claim 4, wherein the first etch gas etches the tungsten (W) portion at a rate greater than 80 Å/second and a second etch gas etches the tungsten (W) portion at a rate of less than 70 Å/second, and the second etch gas removes the boron phosphor silicate glass (BPSG) at a rate of 20 Å/second to 40 Å/second.

8. The etch method of claim 1, wherein the first etch gas removes the tungsten (W) portion selective to the titanium nitride (TiN) portion, wherein the selectivity of the first etch gas for etching the tungsten (W) portion selective to the titanium nitride (TiN) portion is greater than 50:1.

9. The etch method of claim 1, wherein the second etch gas removes the tungsten (W) portion selective to the titanium nitride (TiN) portion, wherein the selectivity of the second etch gas for etching the tungsten (W) portion selective to the titanium nitride (TiN) portion is greater than 1:1 and less than 5:1.

10. A method of manufacturing an electrode comprising:
    providing at least one tungsten (W) metal stud positioned in a via extending into a first dielectric layer, wherein an electrically conductive liner of titanium nitride (TiN) is positioned between at least a sidewall of the via and the at least one tungsten (W) metal stud;
    applying a first etch gas to recess an upper surface of the at least one tungsten (W) metal stud below an upper surface of the first dielectric layer to provide at least one recessed tungsten (W) metal stud, wherein the first etch gas is composed of sulfur hexafluoride ($SF_6$) and oxygen ($O_2$), in which the ratio of sulfur hexafluoride ($SF_6$) to oxygen ($O_2$) ranges from 1:3.5 to 1:4.5;
    applying a second etch gas to the at least one recessed tungsten metal stud, wherein the second etch gas is composed of nitrogen trifluoride ($NF_3$), helium (He) and chlorine ($Cl_2$), in which the ratio of nitrogen trifluoride ($NF_3$) to chlorine ($Cl_2$) ranges from 1:5 to 2:5; and the ratio of helium (He) to nitrogen trifluoride ($NF_3$) and chlorine ($Cl_2$) ranges from 1:3 to 1:1, and forming a second dielectric layer atop the at least one recessed metal stud, wherein an upper surface of the electrically conductive liner is exposed.

11. A method of manufacturing a memory device comprising:
    providing at least one tungsten (W) metal stud positioned in a via extending into a first dielectric layer, wherein an electrically conductive liner of titanium nitride (TiN) is positioned between at least a sidewall of the via and the at least one tungsten (W) metal stud;
    applying a first etch gas to recess an upper surface of the at least one tungsten (W) metal stud below an upper surface of the first dielectric layer to provide at least one recessed tungsten (W) metal stud, wherein the first etch gas is composed of sulfur hexafluoride ($SF_6$) and oxygen ($O_2$), in which the ratio of sulfur hexafluoride ($SF_6$) to oxygen ($O_2$) ranges from 1:3.5 to 1:4.5;
    applying a second etch gas to the at least one recessed tungsten metal stud, wherein the second etch gas is composed of nitrogen trifluoride ($NF_3$), helium (He) and chlorine ($Cl_2$), in which the ratio of nitrogen trifluoride ($NF_3$) to chlorine ($Cl_2$) ranges from 1:5 to 2:5 and the ratio of helium (He) to nitrogen trifluoride ($NF_3$) and chlorine ($Cl_2$) ranges from 1:3 to 1:1; forming a second dielectric layer atop the at least one recessed metal stud, wherein an upper surface of the electrically conductive liner is exposed; and forming a phase change memory cell in contact with the upper surface of the electrically conductive liner.

12. The method of claim 11, wherein the first dielectric layer comprises a boron phosphor silicate glass (BPSG) oxide and the second dielectric layer comprises an silicon oxide.

13. The method of claim 11, wherein an upper surface of the at least one recessed metal stud is from 10 nm to 50 nm from the upper surface the first dielectric layer.

14. The method of claim 11, wherein forming the phase change memory cell comprises:

forming a third dielectric layer atop the second dielectric layer, the first dielectric layer and the upper surface of the electrically conductive liner;

forming an opening in the third dielectric layer, wherein the center of the opening is offset from the center of the via to expose only a portion of the upper surface of the electrically conductive liner; and depositing a phase change material in the opening.

15. The method of claim 14, wherein the phase change material comprises Ge, Sb, Te or a combination thereof.

16. The method of claim 15, wherein the deposition of the phase change material comprises chemical vapor deposition.

17. The method of claim 16, wherein the phase change memory cell further comprises a layer atop the phase change material comprising a barrier metal.

18. The method of claim 17, wherein the layer atop the phase change material comprises TiN.

* * * * *